(12) United States Patent
Lee et al.

(10) Patent No.: US 8,047,693 B2
(45) Date of Patent: Nov. 1, 2011

(54) COOLING DEVICE FOR LIGHT EMITTING DEVICE PACKAGE OF VIBRATION GENERATING MACHINE AND HEAD LAMP FOR VIBRATION GENERATING MACHINE

(75) Inventors: Young Ki Lee, Gyunggi-do (KR); Seog Moon Choi, Seoul (KR); Sang Hyun Shin, Gyunggi-do (KR); Shan Gao, Gyunggi-do (KR); Jong Woon Kim, Seoul (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 309 days.

(21) Appl. No.: 12/507,356

(22) Filed: Jul. 22, 2009

(65) Prior Publication Data

US 2010/0124071 A1    May 20, 2010

(30) Foreign Application Priority Data

Nov. 19, 2008    (KR) .................. 10-2008-0115397

(51) Int. Cl.
*F21V 7/00*    (2006.01)
(52) U.S. Cl. ............. 362/516; 362/294; 165/109.1
(58) Field of Classification Search ............. 362/547, 362/544–546, 294, 373, 530, 218, 345; 165/80.3, 165/185, 121, 109.1
See application file for complete search history.

(56) References Cited

U.S. PATENT DOCUMENTS 6,901,993 B2 *   6/2005  Lee et al. ............. 165/80.3
2004/0206475 A1 * 10/2004  Lee et al. ............. 165/78

FOREIGN PATENT DOCUMENTS

WO    WO 2008/117211 A1   10/2008

OTHER PUBLICATIONS

Korean Office Action, w/ English translation thereof, issued in Korean Patent Application No. KR 10-2008-0115397 dated Jan. 10, 2011.

* cited by examiner

*Primary Examiner* — John A Ward
(74) *Attorney, Agent, or Firm* — McDermott Will & Emery LLP (57) ABSTRACT

A cooling device for a light emitting device package of a vibration generating machine, includes: a heat releasing plate provided at one side of the light emitting device package; a vibrator disposed to face the heat releasing plate and vibrating to generate an air flow according to vibration of the vibration generating machine; and a vibration transfer unit configured to connect the vibrator and the heat releasing plate to allow the air flow generated from the vibrator to be transferred to the heat releasing plate so as to be cooled.

23 Claims, 5 Drawing Sheets

COOLING DEVICE FOR LIGHT EMITTING DEVICE PACKAGE OF VIBRATION GENERATING MACHINE AND HEAD LAMP FOR VIBRATION GENERATING MACHINE

CROSS-REFERENCE TO RELATED APPLICATIONS

This application claims the priority of Korean Patent Application No. 2008-0115397 filed on Nov. 19, 2008, in the Korean Intellectual Property Office, the disclosure of which is incorporated herein by reference.

BACKGROUND OF THE INVENTION

1. Field of the Invention

The present invention relates to a cooling device for a light emitting device package of a vibration generating machine and a head lamp for the vibration generating machine, and more particularly, to a cooling device for a light emitting device package for a vibration generating machine capable of cooling the light emitting device package used for the vibration generating machine by using vibration of the vibration generating machine itself, and a head lamp for the vibration generating machine.

2. Description of the Related Art

In general, a light emitting element (e.g., a light emitting diode, etc.) refers to a diode that emits excessive energy as light when injected electrons and holes are recombined.

With the advantages of a small size, the intensity of illumination of light, a long life span, and the like, the light emitting diode is increasingly used. Generally, the LED is used by being attached with a chip on a package body with phosphor or a resin mounted thereon through wire bonding. When the LED operates, the LED-attached portion has a temperature of about 150° C., and if the temperature exceeds 150° C., the attachment of the LED is broken to lose the use of the LED.

To ensure a long life span, the LED-attached portion should maintain at 120° C. or lower. An LED package used for a head lamp structure for a vibration generating machine that generates vibration due to the movement of bicycles, automobiles, trains, and the like, includes a structure for releasing heat of the LED.

Methods for cooling the head lamp for the conventional vibration generating machine may be classified into a passive cooling method using only a heat sink and a forcible cooling method using a cooling fan or pump in which a convection current heat transfer medium flows.

However, the passive cooling method using the heat sink has a low cooling efficiency, and the forcible cooling method using the cooling fan or the pump requires additional energy or space.

SUMMARY OF THE INVENTION

An aspect of the present invention provides a cooling device for a light emitting device package of a vibration generating machine capable of cooling the light emitting device package used for the vibration generating machine by using vibration of the vibration generating machine itself, and a head lamp for the vibration generating machine.

According to an aspect of the present invention, there is provided a cooling device for a light emitting device package of a vibration generating machine, including: a heat releasing plate provided at one side of the light emitting device package; a vibrator disposed to face the heat releasing plate and vibrating to generate an air flow according to vibration of the vibration generating machine; and a vibration transfer unit configured to connect the vibrator and the heat releasing plate to allow the air flow generated from the vibrator to be transferred to the heat releasing plate so as to be cooled.

The heat releasing plate may be a heat sink including heat releasing pins, and the vibrator may include cooling pins disposed between the heat releasing pins.

The heat releasing plate and the vibrator may include pins, respectively, and the pins may be disposed such that their combs are inserted to each other.

The heat releasing plate and the vibrator may be disposed to be inserted by mutual pins, and an air flow may be generated at a space between the pins according to vibration of the vibrator.

The vibration transfer unit may be an elastic spring with a natural frequency corresponding to that of the vibrator.

One end of the elastic spring may be connected to the heat releasing plate, and the other end of the elastic spring may be connected to a corner of the vibrator or to a face adjacent to the corner.

The elastic spring may be made of a thermally conductive material to release heat of the light emitting device package.

According to another aspect of the present invention, there is provided a cooling device for a light emitting device package of a vibration generating machine, including: a heat releasing plate provided at one side of the light emitting device package; a vibrator disposed to face the heat releasing plate and vibrating to generate an air flow according to vibration of the vibration generating machine; and a vibration transfer unit configured to connect the vibrator and the vibration generating machine to allow the air flow generated from the vibrator to be transferred to the heat releasing plate so as to be cooled.

The heat releasing plate may be a heat sink including heat releasing pins, and the vibrator may include cooling pins disposed between the hear releasing pins.

The heat releasing plate and the vibrator may include pins, respectively, the pins may be disposed such that their combs are inserted to each other, and an air flow may be generated at a space between the pins according to vibration of the vibrator.

The vibration transfer unit may be an elastic spring with a natural frequency corresponding to that of the vibrator.

One end of the elastic spring may be connected to the heat releasing plate, and the other end of the elastic spring may be connected to a corner of the vibrator or to a face adjacent to the corner.

The elastic spring may be made of a thermally conductive material to release heat of the light emitting device package.

According to still another aspect of the present invention, there is provided a head lamp for a vibration generating machine, including: a light emitting device package serving as a light source for emitting light; a reflector configured to reflect light from the light emitting device package to a front side; a heat releasing plate provided at one side of the light emitting device package; a vibrator disposed to face the heat releasing plate and vibrating to generate an air flow according to vibration of the vibration generating machine; and a vibration transfer unit configured to connect the vibrator and the heat releasing plate to allow the air flow generated from the vibrator to be transferred to the heat releasing plate so as to be cooled.

The heat releasing plate and the vibrator may include pins, respectively, the pins may be disposed such that their combs are inserted to each other, and an air flow may be generated at a space between the pins according to vibration of the vibrator.

The vibration transfer unit may be an elastic spring with a natural frequency corresponding to that of the vibrator.

One end of the elastic spring may be connected to the heat releasing plate, and the other end of the elastic spring may be connected to a corner of the vibrator or to a face adjacent to the corner.

The elastic spring may be made of a thermally conductive material to release heat of the light emitting device package.

According to yet another aspect of the present invention, there is provided a head lamp for a vibration generating machine, including: a light emitting device package serving as a light source for emitting light; a reflector configured to reflect light from the light emitting device package to a front side; a heat releasing plate provided at one side of the light emitting device package; a vibrator disposed to face the heat releasing plate and vibrating to generate an air flow according to vibration of the vibration generating machine; and a vibration transfer unit configured to connect the vibrator and the vibration generating machine to allow the air flow generated from the vibrator to be transferred to the heat releasing plate so as to be cooled.

The heat releasing plate and the vibrator may include pins, respectively, the pins may be disposed such that their combs are inserted to each other, and an air flow may be generated at a space between the pins according to vibration of the vibrator.

The vibration transfer unit may be an elastic spring with a natural frequency corresponding to that of the vibrator.

One end of the elastic spring may be connected to a frame provided at the vibration generating machine, and the other end of the elastic spring may be connected to a corner of the vibrator or to a face adjacent to the corner.

The elastic spring may be made of a thermally conductive material to release heat of the light emitting device package.

The cooling device for a light emitting device package used for the vibration generating machine and the head lamp of the vibration generating machine according to the present invention exhibit a better cooling efficiency than the passive cooling method using only a heat sink and have a simpler structure than that of forcible cooling method using a cooling fan or a pump.

In addition, with the cooling device for a light emitting device package used for the vibration generating machine and the head lamp of the vibration generating machine according to the present invention, the light emitting device package is cooled by using vibration of the vibration generating machine itself without employing a cooling fan or a pump, so external energy does not need to be used, and in addition, a space utilization of the vibration generating machine can be increased.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art.

In the drawings, the shapes and dimensions may be exaggerated for clarity, and the same reference numerals will be used throughout to designate the same or like components.

Figure 1:
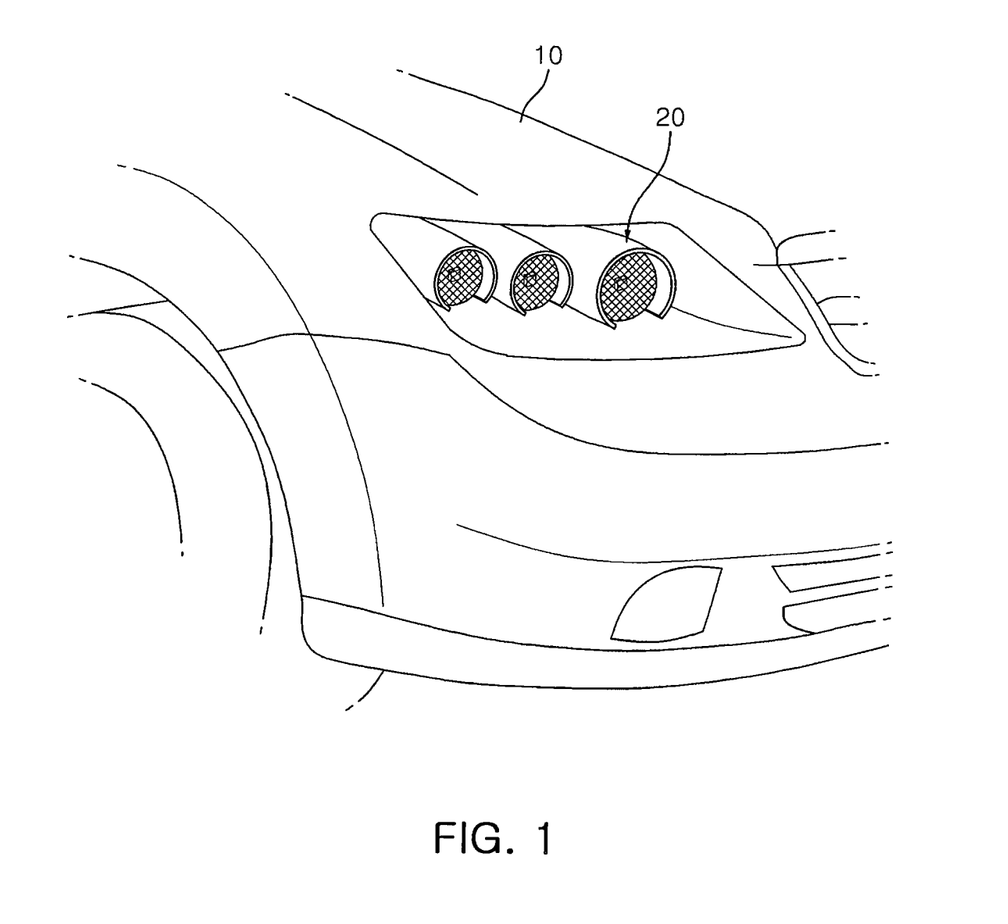
FIG. 1 is a schematic perspective view illustrating a cooling device for a light emitting device package of a vibration generating machine mounted at a head lamp of the vibration generating machine according to an embodiment of the present invention.
Figure 2:
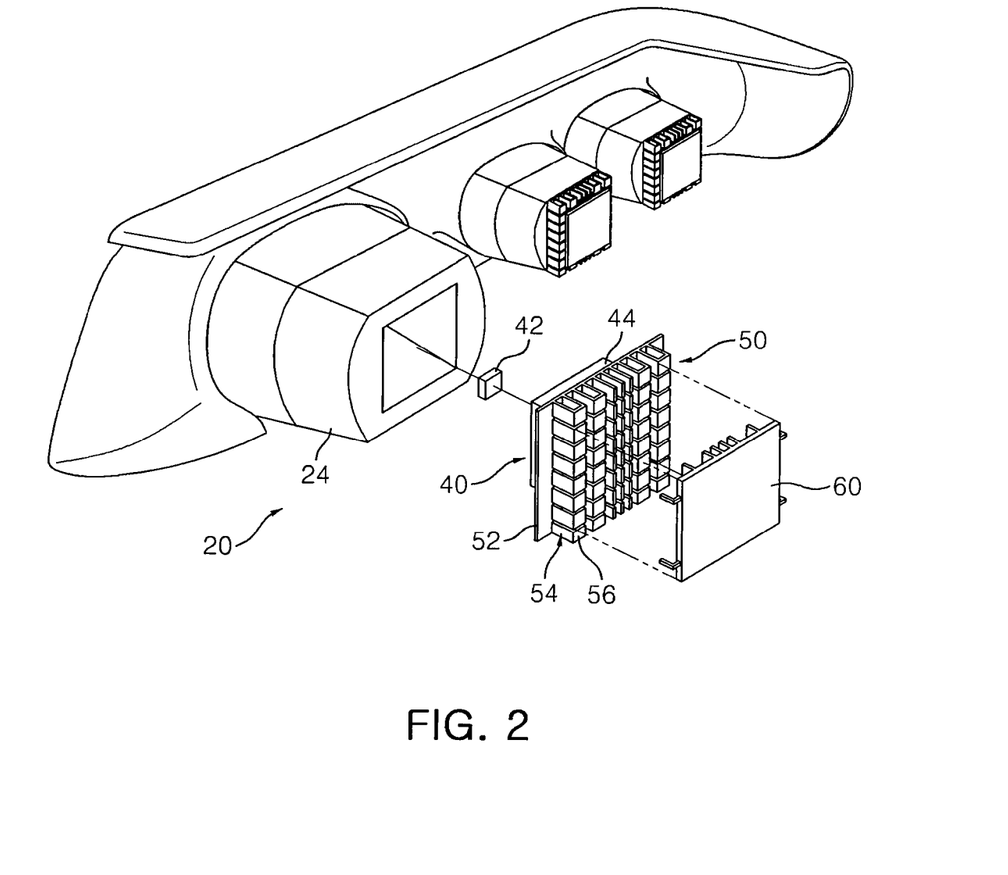
FIG. 2 is a rear exploded perspective view illustrating the cooling device for the light emitting device package of the vibration generating machine mounted at the head lamp of the vibration generating machine according to one embodiment of the present invention.

FIG. 1 is a schematic perspective view illustrating a cooling device for a light emitting device package of a vibration generating machine mounted at a head lamp of the vibration generating machine according to an embodiment of the present invention, and FIG. 2 is a rear exploded perspective view illustrating the cooling device for the light emitting device package of the vibration generating machine mounted at the head lamp of the vibration generating machine according to one embodiment of the present invention.

With reference to FIGS. 1 and 2, a cooling device 50 of a light emitting device package 40 of a vibration generating machine according to an embodiment of the present invention includes a heat releasing plate 52, a vibrator 60, and a vibration transfer unit 64.

The cooling device 50 of the light emitting device package 40 of a vibration generating machine may be applied to any vibration generating machine 10 that generates vibration according to the movement of automobiles, bicycles, trains, and the like, and in particular, the cooling device 50 may be applied to a head lamp 20 that emits light to front and rear sides of the vibration generating machine 10.

Namely, the head lamp 20 of the vibration generating machine 10 with the cooling device 50 of the light emitting device package 40 applied thereto includes the light emitting device package 40, a reflector 24, a heat releasing plate 52, a vibrator 60, and a vibration transfer unit 64.

The major elements of the cooling device 50 of the light emitting device package according to an embodiment of the present invention will now be described.

As the light emitting device package 40, a top view type LED in which a light emitting element 42 is inserted in an electrode-mounted package body 44 may be used.

The light emitting element 42 may be connected to the electrode mounted on the package body 44 through chip bonding or wire bonding.

The heat releasing plate 52 may externally release heat generated from the light emitting element 42 without deforming the outer appearance of the light emitting device package 40.

In order to increase an air medium contact region with the exterior, the heat releasing plate 52 may include a heat sink 54 including heat releasing pins 56.

The heat releasing pins 56 are pins protruded from the heat releasing plate 52 and have a tubular shape in which an air flow path is formed. The heat releasing pins 56 are formed at certain intervals therebetween.

The vibrator 60 is disposed to face the heat releasing plate 52. When the vibration generating machine 10 vibrates, the vibrator generates an air flow according to the vibration of the vibration generating machine 10.

In order to generate an air flow according to vibration of the vibrator 60, the vibrator 60 and the heat releasing plate 52 need to be connected by the vibration transfer unit 64 made of an elastic material.

Vibration of the vibration generating machine 10 is transferred to, for example, a vehicle body according to a road situation or an engine operation, and the thusly transferred vibration makes the vibrator 60 vibrate.

The vibration of the vibrator 60 causes an air flow at the heat releasing plate 52 to cool heat generated from the light emitting element 42.

The cooling device 50 of the light emitting device package may be combined with the reflector 24 that reflects light from the light emitting element of the vibration generating machine 10 so as to be irradiated to the front side, and applied for the head lamp 20.

Figure 3:
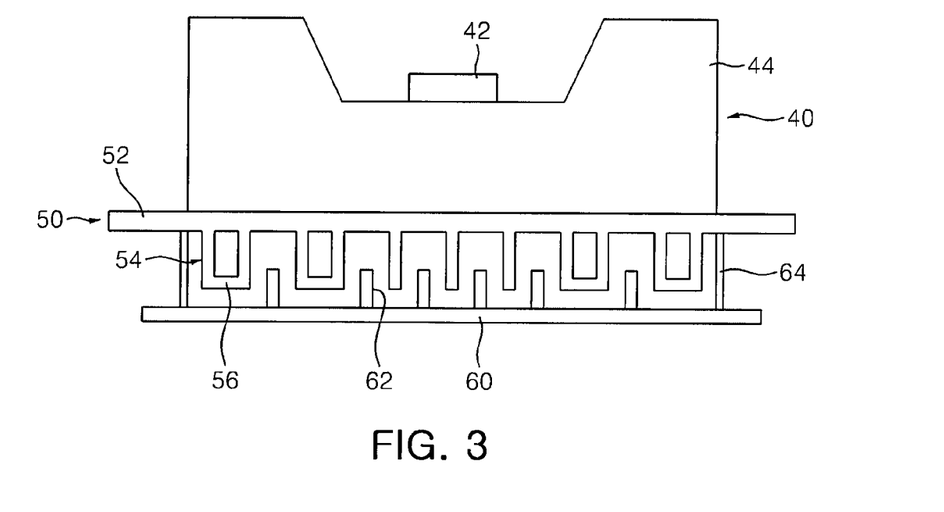
FIG. 3 is a sectional view illustrating the cooling device for the light emitting device package of FIG. 2.
Figure 4:
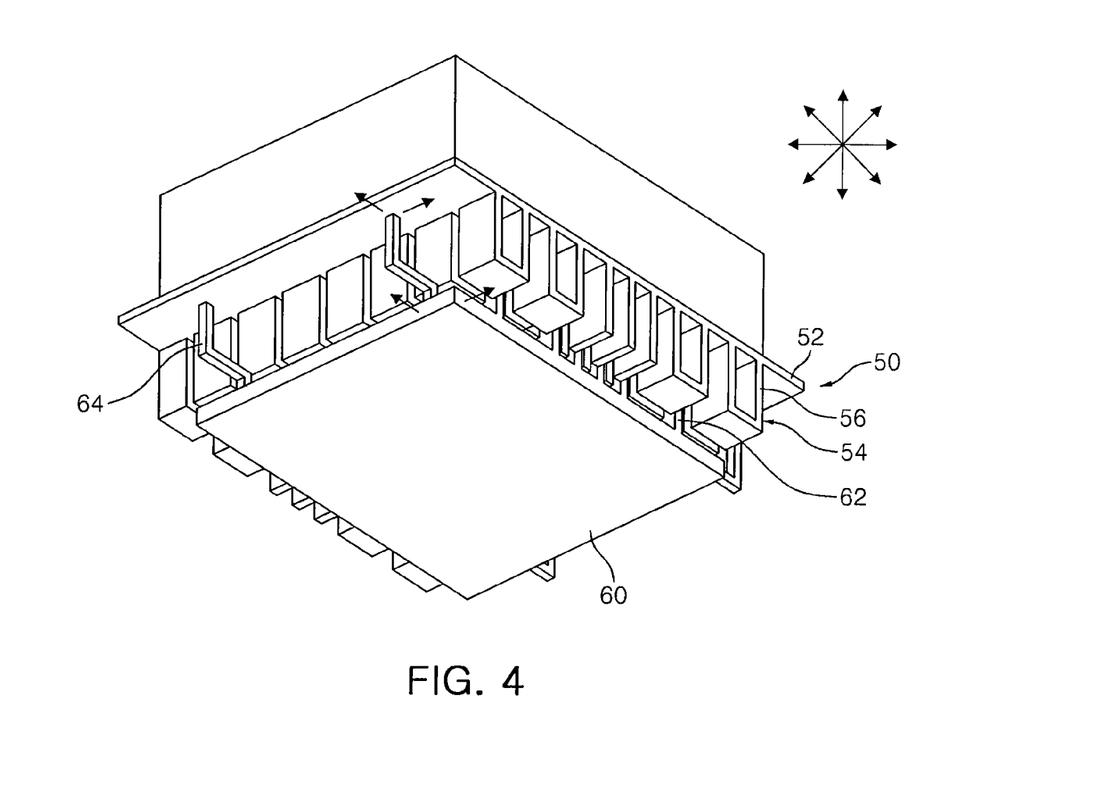
FIG. 4 is a schematic bottom perspective view illustrating the cooling device for the light emitting device package of FIG. 2.

FIG. 3 is a sectional view illustrating the cooling device for the light emitting device package of FIG. 2, and FIG. 4 is a schematic bottom perspective view illustrating the cooling device for the light emitting device package of FIG. 2.

With reference to FIGS. 3 and 4, in order to enhance the heat releasing efficiency of the cooling device 50 of the light emitting device package as described above, the heat releasing plate 52 includes the heat sink 54 with the heat releasing pins 56 formed at its lower surface, and the vibrator 60 may include cooling pins 62 disposed between the heat releasing pins 56.

In particular, the heat releasing pins 56 and the cooling pins 62 respectively formed on the heat releasing plate 52 and the vibrator 60 may be disposed such that their combs are inserted with each other.

The light emitting device package 40 is fixedly inserted into the reflector 24 of the head lamp 20, and the vibrator 60 is moved by the vibration transfer unit 64, an elastic member connected to the heat releasing plate 52 of the fixed light emitting device package 40, when the vibration generating machine 10 vibrates.

Meanwhile, the vibration transfer unit 64 may be formed as an elastic spring having a natural frequency corresponding to that of the vibrator 60, and the natural frequency of the elastic spring may be easily selected by the person in the art according to a design of the spring.

The vibration transfer unit 64 may determine a vibration direction of the vibrator 60 on the heat releasing plate 52, and one end of the elastic spring may be connected to the heat releasing plate 52 and the other end of the elastic spring may be connected to a corner of the vibrator 60 or a face adjacent to the corner.

According to vibration of the elastic spring and the vibrator 60 each having the determined vibration direction and natural frequency, the cooling pins 62 move between the heat releasing pins 56 of the heat releasing plate 52, generating an air flow.

Generating an air flow and made of good thermal conductivity, the elastic spring can release heat generated from the light emitting device package 40.

Figure 5:
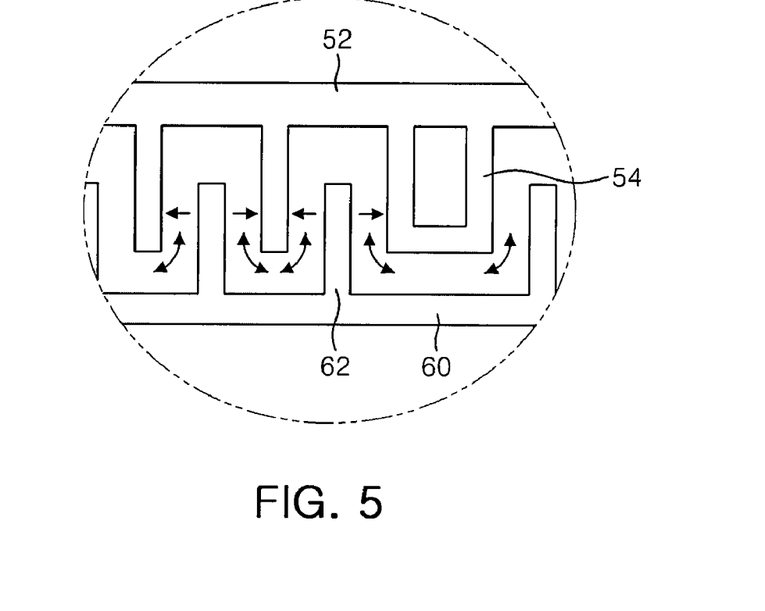
FIG. 5 is a schematic sectional view illustrating a heat sink and cooling pins constituting the cooling device for the light emitting device package of FIG. 2 according to a first embodiment of the present invention.
Figure 6:
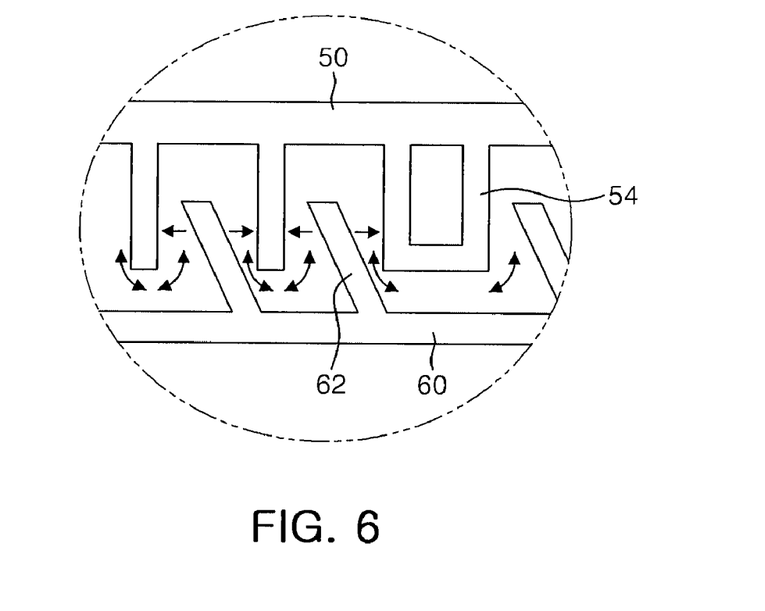
FIG. 6 is a schematic sectional view illustrating the heat sink and cooling pins constituting the cooling device for the light emitting device package of FIG. 2 according to a second embodiment of the present invention.

FIG. 5 is a schematic sectional view illustrating the heat sink and the cooling pins constituting the cooling device for the light emitting device package of FIG. 2 according to a first embodiment of the present invention, and FIG. 6 is a schematic sectional view illustrating the heat sink and cooling pins constituting the cooling device for the light emitting device package of FIG. 2 according to a second embodiment of the present invention.

With reference to FIGS. 5 and 6, the cooling pins 62 disposed between the heat releasing pins 56 may be implemented in various forms. For example, the cooling pins 62 may be formed be vertical as shown in FIG. 5, or may be formed to be inclined at a certain angle as shown in FIG. 6.

If the cooling pins 62 are formed to be inclined, the pins with the same size can be deeply inserted between the heat releasing pins 56, further utilizing the space of the vehicle body.

Figure 7:
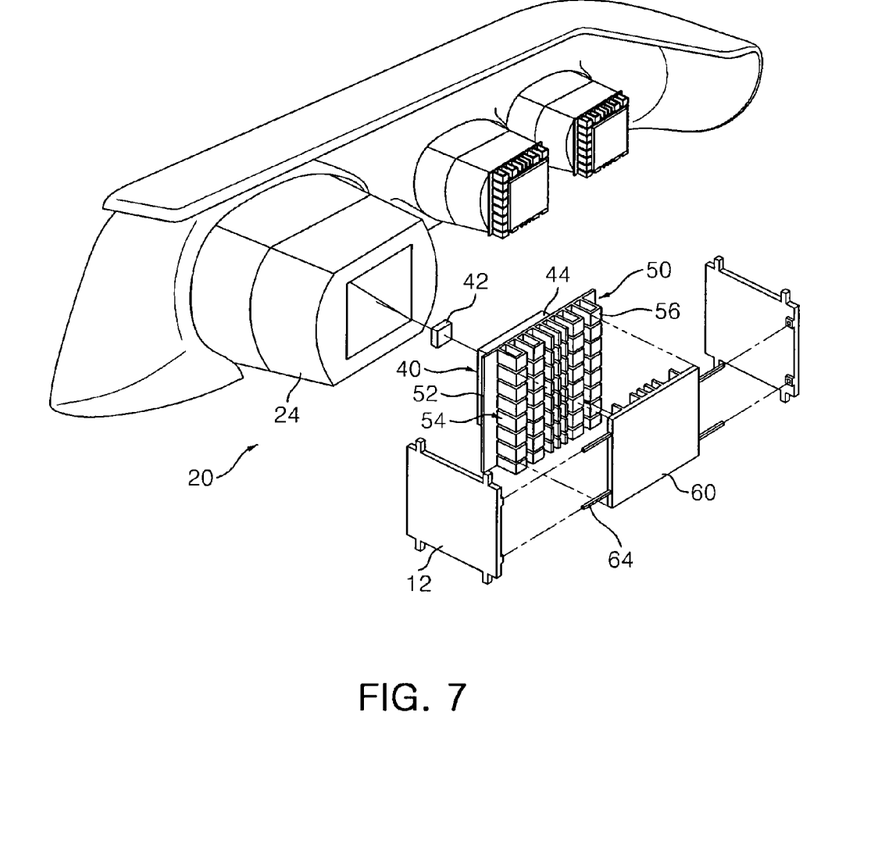
FIG. 7 is a rear schematic perspective view illustrating the cooling device for the light emitting device package of the vibration generating machine mounted on the head lamp of the vibration generating machine according to another embodiment of the present invention.

FIG. 7 is a rear schematic perspective view illustrating the cooling device for the light emitting device package of the vibration generating machine mounted on the head lamp of the vibration generating machine according to another embodiment of the present invention.

With reference to FIG. 7, the cooling device 50 of the light emitting device package 40 includes the heat releasing plate 52, the vibrator 60, and the vibration transfer unit 64.

The cooling device 50 of the light emitting device package 40 of a vibration generating machine may be applied to the head lamp 20 of any vibration generating machine 10 that generates vibration according to the movement of automobiles, bicycles, trains, and the like.

Namely, the head lamp 20 of the vibration generating machine 10 with the cooling device 50 of the light emitting device package 40 applied thereto according to the present invention includes the light emitting device package 40, the reflector 24, the heat releasing plate 52, the vibrator 60, and the vibration transfer unit 64.

In this embodiment, the vibration transfer unit 64 is connected to a particular portion of the vibration generating machine 10, namely, a frame 12 provided in the vehicle body. This is different from the case where the vibration transfer unit 64 is disposed at the heat releasing plate 52 as shown in FIG. 2.

When the vibration transfer unit 64 is connected to the heat releasing plate 52 on which the heat sink 54 is formed, it may inconveniently need to be welded to the heat releasing plate 52 with the heat releasing plate 56 interposed therebetween. Thus, connection of the vibration transfer unit 64 to the frame 12 of the vibration generating machine can enhance the convenience of operation.

The major elements such as the heat releasing plate, the vibrator, and the like, according to the second embodiment are the same as those of the first embodiment of the present invention, so its detailed description will be omitted.

As set forth above, the cooling device for the light emitting device package used for the vibration generating machine and the head lamp for the vibration generating machine according to exemplary embodiments of the present invention exhibit the better cooling efficiency than the passive cooling method using only the heat sink and have a simpler structure than the forcible cooing method using a cooling fan or a pump.

In addition, with the cooling device for a light emitting device package used for the vibration generating machine and the head lamp of the vibration generating machine according to the present invention, the light emitting device package is cooled by using vibration of the vibration generating machine itself without employing a cooling fan or a pump, so external energy does not need to be used, and in addition, a space utilization of the vibration generating machine can be increased.

While the present invention has been shown and described in connection with the exemplary embodiments, it will be apparent to those skilled in the art that modifications and variations can be made without departing from the spirit and scope of the invention as defined by the appended claims.

What is claimed is:

1. A cooling device for a light emitting device package of a vibration generating machine, the device comprising:
    a heat releasing plate provided at one side of the light emitting device package;
    a vibrator disposed to face the heat releasing plate and vibrating to generate an air flow according to vibration of the vibration generating machine; and
    a vibration transfer unit configured to connect the vibrator and the heat releasing plate to allow the air flow generated from the vibrator to be transferred to the heat releasing plate so as to be cooled.

2. The cooling device of claim 1, wherein the heat releasing plate is a heat sink comprising heat releasing pins, and the vibrator comprises cooling pins disposed between the heat releasing pins.

3. The cooling device of claim 1, wherein the heat releasing plate and the vibrator comprise pins, respectively, and the pins are disposed such that their combs are inserted to each other.

4. The cooling device of claim 1, wherein the heat releasing plate and the vibrator are disposed to be inserted by mutual pins, and an air flow is generated at a space between the pins according to vibration of the vibrator.

5. The cooling device of claim 1, wherein the vibration transfer unit is an elastic spring with a natural frequency corresponding to that of the vibrator.

6. The cooling device of claim 5, wherein one end of the elastic spring is connected to the heat releasing plate, and the other end of the elastic spring is connected to a corner of the vibrator or to a face adjacent to the corner.

7. The cooling device of claim 5, wherein the elastic spring is made of a thermally conductive material to release heat of the light emitting device package.

8. A cooling device for a light emitting device package of a vibration generating machine, the device comprising:
    a heat releasing plate provided at one side of the light emitting device package;
    a vibrator disposed to face the heat releasing plate and vibrating to generate an air flow according to vibration of the vibration generating machine; and
    a vibration transfer unit configured to connect the vibrator and the vibration generating machine to allow the air flow generated from the vibrator to be transferred to the heat releasing plate so as to be cooled.

9. The cooling device of claim 8, wherein the heat releasing plate is a heat sink comprising heat releasing pins, and the vibrator comprises cooling pins disposed between the hear releasing pins.

10. The cooling device of claim 8, wherein the heat releasing plate and the vibrator comprise pins, respectively, the pins are disposed such that their combs are inserted to each other, and an air flow is generated at a space between the pins according to vibration of the vibrator.

11. The cooling device of claim 8, wherein the vibration transfer unit is an elastic spring with a natural frequency corresponding to that of the vibrator.

12. The cooling device of claim 11, wherein one end of the elastic spring is connected to the heat releasing plate, and the other end of the elastic spring is connected to a corner of the vibrator or to a face adjacent to the corner.

13. The cooling device of claim 11, wherein the elastic spring is made of a thermally conductive material to release heat of the light emitting device package.

14. A head lamp for a vibration generating machine, the head lamp comprising:
    a light emitting device package serving as a light source for emitting light;
    a reflector configured to reflect light from the light emitting device package to a front side;
    a heat releasing plate provided at one side of the light emitting device package;
    a vibrator disposed to face the heat releasing plate and vibrating to generate an air flow according to vibration of the vibration generating machine; and
    a vibration transfer unit configured to connect the vibrator and the heat releasing plate to allow the air flow generated from the vibrator to be transferred to the heat releasing plate so as to be cooled.

15. The head lamp of claim 14, wherein the heat releasing plate and the vibrator comprise pins, respectively, the pins are disposed such that their combs are inserted to each other, and an air flow is generated at a space between the pins according to vibration of the vibrator.

16. The head lamp of claim 14, wherein the vibration transfer unit is an elastic spring with a natural frequency corresponding to that of the vibrator.

17. The head lamp of claim 16, wherein one end of the elastic spring is connected to the heat releasing plate, and the other end of the elastic spring is connected to a corner of the vibrator or to a face adjacent to the corner.

18. The head lamp of claim 16, wherein the elastic spring is made of a thermally conductive material to release heat of the light emitting device package.

19. A head lamp for a vibration generating machine, the head lamp comprising:
    a light emitting device package serving as a light source for emitting light;
    a reflector configured to reflect light from the light emitting device package to a front side;
    a heat releasing plate provided at one side of the light emitting device package;
    a vibrator disposed to face the heat releasing plate and vibrating to generate an air flow according to vibration of the vibration generating machine; and
    a vibration transfer unit configured to connect the vibrator and the vibration generating machine to allow the air flow generated from the vibrator to be transferred to the heat releasing plate so as to be cooled.

20. The head lamp of claim 19, wherein the heat releasing plate and the vibrator comprise pins, respectively, the pins are disposed such that their combs are inserted to each other, and an air flow is generated at a space between the pins according to vibration of the vibrator.

21. The head lamp of claim 19, wherein the vibration transfer unit is an elastic spring with a natural frequency corresponding to that of the vibrator.

22. The head lamp of claim 21, wherein one end of the elastic spring is connected to a frame provided at the vibration generating machine, and the other end of the elastic spring is connected to a corner of the vibrator or to a face adjacent to the corner.

23. The head lamp of claim 21, wherein the elastic spring is made of a thermally conductive material to release heat of the light emitting device package.

* * * * *